(12) United States Patent
Tanaka et al.

(10) Patent No.: US 7,226,664 B2
(45) Date of Patent: Jun. 5, 2007

(54) LAMINATED POLYESTER FILM, FLAME-RETARDANT POLYESTER FILM THEREOF, COPPER-CLAD LAMINATED PLATE AND CIRCUIT SUBSTRATE

(75) Inventors: Shotaro Tanaka, Moriyama (JP); Junpei Ohashi, Otsu (JP); Yasushi Takada, Otsu (JP)

(73) Assignee: Toray Industries, Inc. (JP)

( * ) Notice: Subject to any disclaimer, the term of this patent is extended or adjusted under 35 U.S.C. 154(b) by 0 days.

(21) Appl. No.: 11/439,793

(22) Filed: May 24, 2006

(65) Prior Publication Data

US 2006/0269764 A1 Nov. 30, 2006

(30) Foreign Application Priority Data

May 26, 2005 (JP) ............................. 2005-154065

(51) Int. Cl.
| B32B 27/08 | (2006.01) |
| B32B 15/09 | (2006.01) |
| B32B 27/26 | (2006.01) |
| B32B 27/28 | (2006.01) |
| B32B 27/36 | (2006.01) |

(52) U.S. Cl. .................. 428/458; 428/457; 428/473.5; 428/480; 428/482; 528/308; 528/308.6; 528/308.7

(58) Field of Classification Search ..................... None
See application file for complete search history.

(56) References Cited

U.S. PATENT DOCUMENTS

| 4,419,507 | A | * | 12/1983 | Sublett | ........................ | 528/302 |
| 4,562,225 | A | * | 12/1985 | Huber et al. | ................. | 524/602 |
| 4,605,591 | A | * | 8/1986 | Nose et al. | .................. | 428/332 |
| 4,731,398 | A | * | 3/1988 | Huber et al. | ................. | 523/500 |
| 4,806,588 | A | * | 2/1989 | Fujimoto et al. | ........... | 524/505 |
| 6,060,175 | A | * | 5/2000 | Swisher | ....................... | 428/612 |
| 6,165,602 | A | * | 12/2000 | Fujita | .......................... | 428/216 |
| 6,180,209 | B1 | * | 1/2001 | Sato et al. | .................. | 428/141 |
| 6,194,061 | B1 | * | 2/2001 | Satoh et al. | ................ | 428/341 |
| H001982 | H | * | 8/2001 | Dunn et al. | ................. | 427/258 |
| 6,306,492 | B1 | * | 10/2001 | Yamada et al. | .......... | 428/317.7 |
| 6,348,267 | B1 | * | 2/2002 | Okajima | .................. | 428/423.7 |
| 6,403,224 | B1 | * | 6/2002 | Okajima et al. | ......... | 428/423.7 |
| 6,455,136 | B1 | * | 9/2002 | Okajima et al. | ........... | 428/32.1 |
| 6,818,699 | B2 | * | 11/2004 | Kajimaru et al. | ........... | 524/845 |
| 6,828,010 | B2 | * | 12/2004 | Kubota et al. | .............. | 428/213 |
| 6,991,849 | B2 | * | 1/2006 | Oya | .......................... | 428/353 |
| 7,005,176 | B2 | * | 2/2006 | Tojo et al. | .................. | 428/141 |
| 7,026,035 | B2 | * | 4/2006 | Yano et al. | ................. | 428/141 |
| 2004/0028924 | A1 | * | 2/2004 | Kubota et al. | .............. | 428/480 |
| 2004/0081839 | A1 | * | 4/2004 | Kubo et al. | ................. | 428/482 |
| 2005/0064198 | A1 | * | 3/2005 | Takada et al. | ........... | 428/411.1 |

FOREIGN PATENT DOCUMENTS

| JP | 2-60941 | A |   | 3/1990 |
| JP | 6-293838 | A |   | 10/1994 |
| JP | 06-293839 |   | * | 10/1994 |
| JP | 6-293839 | A |   | 10/1994 |
| JP | 7-242758 | A |   | 9/1995 |
| JP | 10-278206 | A |   | 10/1998 |
| JP | 2003-080651 |   | * | 3/2003 |
| JP | 2003-80651 | A |   | 3/2003 |
| JP | 2003-136660 |   | * | 5/2003 |
| JP | 2003-136660 | A |   | 5/2003 |
| JP | 2004-243760 | A |   | 9/2004 |

* cited by examiner

*Primary Examiner*—Vivian Chen
(74) *Attorney, Agent, or Firm*—DLA Piper US LLP

(57) ABSTRACT

The present invention is to provide a laminated polyester film with excellent adhesive properties for use in a laminating material, and the laminated polyester film is a film in which a resin layer including a polyester resin and a oxazoline-based cross-linking agent is laminated on at least one side surface of polyester film, diethylene glycol accounts for 40 mole % or more of all diol components constituting the polyester resin and the mass ratio of the polyester resin to the oxazoline-based cross-linking agent resin layer is within a range of 20/80 to 80/20. Furthermore, the present invention is to provide a flame-retardant polyester film in which a polyimide-including layer is laminated on both sides of the laminated polyester film and also a copper-clad laminated plate in which the flame-retardant polyester film is used, and also a circuit substrate in which the copper-clad laminated plate is used.

6 Claims, No Drawings

LAMINATED POLYESTER FILM, FLAME-RETARDANT POLYESTER FILM THEREOF, COPPER-CLAD LAMINATED PLATE AND CIRCUIT SUBSTRATE

TECHNICAL FIELD

This disclosure relates to a laminated polyester film with excellent adhesive properties for use in various laminating materials and which also has excellent solvent resistance.

To be more specific, the disclosure relates to a laminated polyester film which exhibits excellent adhesive properties, when subjected to heat treatment for long periods of time at high temperatures in laminating various laminating materials, in particular when a laminating material such as metal that is different in dimensional stability under heating from a polyester film is laminated and adhered for long periods of time at high temperatures.

The disclosure also relates to a flame-retardant polyester film, copper-clad laminated plates or circuit substrates in which the laminated polyester film can be used.

The resin layer of the laminated polyester film of the exhibits favorable adhesive properties when thinly formed by in-line coating methods and the like.

BACKGROUND

Concerning a polyester film, in particular, a biaxially-oriented polyester film is used as magnetic recording materials, electrical insulating materials, capacitor materials, packaging materials and construction materials due to their mechanical and electrical properties. Furthermore, the film is also used in a variety of industrial materials in photography, graphic arts and heat-sensitive transcription.

However, a biaxially-oriented polyester film is high in crystalline orientation on the surface and low in adhesive properties with various types of paints and inks, and hence a drawback of the film.

Therefore, various methods have been studied in which adhesive properties are imparted to the surface of polyester film.

Conventionally, there is method for imparting adhesive properties to the surface of polyester film by carrying out various types of good adhesiveness-imparting treatments to the polyester film, which is the base film. For this purpose, many methods have been proposed and studied, for example, a surface activation method in which the surface is treated by corona discharge, ultraviolet irradiation or plasma is given to the film surface, a surface etching method in which chemicals such as acid, alkaline or amine aqueous solutions are used, and a method in which various types of resins with adhesive properties such as acrylic resin, polyester resin, urethane resin or polyolefin resin are provided on the film surface as a primer layer.

A resin layer made with a polyester resin and an oxazoline-based cross-linking agent has been proposed as an good adhesive primer layer with excellent solvent resistance and blocking resistance, for example, on page 5 in the Japanese Published Unexamined Patent Application No. Hei 02-60941, in Claim 1 of the Japanese Published Unexamined Patent Application No. Hei 06-293838, in Claim 1 of the Japanese Published Unexamined Patent Application No. Hei 06-293839, in Claim 1 of the Japanese Published Unexamined Patent Application No. Hei 07-242758, in Claim 1 of the Japanese Published Unexamined Patent Application No. 2004-243760, in Claim 1 of the Japanese Published Unexamined Patent Application No. 2003-136660 and others.

However, a polyester film easily soften or melt when heated and also burn, and hence a drawback.

Increasing requests to make a polyester film flame-retardant have been made due to the possibility of fire, in particular when the film is used in copper-clad laminated plates, adhesive tape, flexible print circuit substrates, membrane switches, film heaters and flat cables as electrical insulating materials or construction materials.

Furthermore, when a polyester film is used as a base film for copper-clad laminated plates to be used as flexible print substrates and the like, the film is required to have layer-to-layer adhesiveness which justifies its use, in addition to the above-described flame-retardant properties.

As disclosed on page 1 to 2 in the Japanese Published Unexamined Patent Application No. Hei 10-278206, a polyester film have been technically improved in regard to flame-retardant properties through the conventional method in which flame-retardants based on bromine, phosphorus or inorganic chemicals are kneaded into a polyester film or in which halogen-including components or phosphorus-including components are subjected to copolymerization.

Furthermore, as disclosed in Claim 1 of the Japanese Published Unexamined Patent Application No. 2004-243760 and in Claim 1 of the Japanese Published Unexamined Patent Application No. 2003-80651, a method has been proposed in which resins such as polyamic acid are laminated onto a polyester film, thereby imparting heat resistance and flame-retardant properties to the film.

However, even when the technology is used which has been disclosed on page 5 in the Japanese Published Unexamined Patent Application No. Hei 02-60941, in Claim 1 of the Japanese Published Unexamined Patent Application No. Hei 06-293838, in Claim 1 of the Japanese Published Unexamined Patent Application No. Hei 06-293839, in Claim 1 of the Japanese Published Unexamined Patent Application No. Hei 07-242758, in Claim 1 of the Japanese Published Unexamined Patent Application No. 2004-243760, in Claim 1 of the Japanese Published Unexamined Patent Application No. 2003-136660 and others, as described above, it is difficult to obtain sufficient adhesiveness when a polyester film is subjected to heat treatment for long periods of time at high temperatures when and/or after a laminating material is provided, and in particular when a laminating material such as metal that is different in dimensional stability under heating from a polyester film is laminated for long periods of time at high temperatures.

For example, when metal is adhered to resin, in general, an adhesive agent made with resin components is used to effect adhesion. However, it is not easy to allow metal to adhere to resin in a short time at low temperatures because they are different in raw materials. In order to attain an excellent adhesiveness, they must be adhered for long periods of time at high temperatures. In particular, when copper foil and a resin film are used to produce a copper-clad laminated plate which is used as a circuit substrate for electrical appliances and electronic devices, strong adhesive properties exceeding 80 g/mm is needed. In order to attain this level of adhesiveness, it is necessary to meet the conditions that adhesion is made for long periods of time at high temperatures.

However, where a material such as metal that is different in dimensional stability under heating (heat shrinkage ratio and thermal expansion factor) from a polyester film is adhered by using an adhesive agent for long periods of time at high temperatures, there is a problem that the dimension changes on adhesion treatment at high temperatures or on cooling after the adhesion treatment due to differences in dimensional stability under heating, resulting in interlayer stress, which subsequently causes poor adhesiveness.

Where a material such as metal that is different in dimensional stability under heating from a polyester film is required to be strongly adhered, good adhesive primer layers described on page 5 in the Japanese Published Unexamined Patent Application No. Hei 02-60941, in Claim 1 of the Japanese Published Unexamined Patent Application No. Hei 06-293838, in Claim 1 of the Japanese Published Unexamined Patent Application No. Hei 06-293839, in Claim 1 of the Japanese Published Unexamined Patent Application No. Hei 07-242758, in Claim 1 of the Japanese Published Unexamined Patent Application No. 2004-243760, in Claim 1 of the Japanese Published Unexamined Patent Application No. 2003-136660 or others are not able to solve the problem, even if provided on a polyester film.

The above-described problem of insufficient adhesiveness is often found particularly when a polyester film is peeled from a boundary face with another layer. Where an good adhesive primer layer is provided on the polyester film, peeling may often develop on a boundary face between the polyester film and a primer layer. Therefore, it is important to improve adhesive properties on the boundary face.

It is also difficult to attain adhesive properties and solvent resistance together. The adhesive properties are the properties of carrying out heat treatment for long periods of time at high temperatures.

Since the invention disclosed in the Japanese Published Unexamined Patent Application No. Hei 10-278206 (on page 1 to 2) is that in which a flame-retardant is added to a polyester film, or polyester is subjected to copolymerization with halogen-including components or phosphorus-including components, there is a problem that intrinsic mechanical properties of the polyester film are reduced. Furthermore, there are concerns that, for example, halogen compounds may develop dioxin and other harmful chemicals, depending on combustion conditions, thereby affecting the environment or contaminating processes, which cause problems.

Furthermore, the technology disclosed in the Japanese Published Unexamined Patent Application No. 2004-243760 (Claim 1 and others) and the Japanese Published Unexamined Patent Application No. 2003-80651(Claim 1 and others) has solved such a problem that flame-retardant properties are imparted without reduction in intrinsic mechanical properties of polyester film. The technology has also improved adhesive properties of the polyester film with resins such as polyamic acid by the use of a good adhesive primer layer.

However, the good adhesive primer layers disclosed in the Japanese Published Unexamined Patent Application No. 2004-243760 (Claim 1 and others) and the Japanese Published Unexamined Patent Application No. 2003-80651 (Claim 1 and others) have failed in providing a sufficient adhesiveness in a case where a laminated material such as metal that is different in dimensional stability under heating from a polyester film is laminated for long periods of time at high temperatures. For example, where a resin such as polyamic acid is laminated on the good adhesive primer layer and thereafter copper foil is laminated on the resin such as polyamic acid for long periods of time at high temperatures, a sufficient adhesiveness is not obtained.

In this instance as well, the problem of an insufficient adhesiveness is more often found where peeling develops on a boundary face between polyester film and an good adhesive primer layer. It is also important to improve adhesive properties on the boundary face.

SUMMARY OF THE INVENTION

The laminated polyester films described herein have the following constitution.

To be more specific, the laminated polyester film of the is a laminated polyester film in which a resin layer including a polyester resin and an oxazoline-based cross-linking agent is laminated at least on a single surface of polyester film, 40 mole % or more of all diol components constituting the polyester resin is diethylene glycol, and the mass ratio of the polyester resin to the oxazoline-based cross-linking agent constituting the resin layer is within a range of 20/80 and 80/20.

Furthermore, the polyester film is a flame-retardant polyester film in which a polyimide-including layer is laminated on both surfaces of the laminated polyester film.

Still furthermore, the copper-clad laminated plate is a copper-clad laminated plate in which the flame-retardant polyester film is used.

In addition, the circuit substrate is a circuit substrate in which the copper-clad laminated plate is used.

As will be explained below, a laminated polyester film with excellent adhesive properties and solvent resistance can be obtained. The adhesive properties are the properties when the film is subjected to heat treatment for long periods of time at high temperature in laminating various laminating materials, in particular when a laminating material such as metal that is different in dimensional stability under heating from a polyester film is laminated for long periods of time at high temperatures.

To be more specific, we provide a laminated polyester film which can be adhered by treatment for long periods of time at high temperatures due to the ability to adhere strongly a material such as metal that is different from a polyester film and, as a result, providing a laminated substrate with metal with excellent adhesive properties.

We also provide a flame-retardant polyester film in which the laminated polyester film is used, a copper-clad laminated plate with excellent adhesive properties as well as excellent circuit substrates.

The resin layer of the laminated polyester film is a resin layer which exhibits adhesive properties favorably even where it is formed thinly by an in-line coating method and the like.

DETAILED DESCRIPTION

Hereinafter, a detailed explanation will be made for the laminated polyester films.

In the laminated polyester film, it is necessary that a resin layer which contains a polyester resin and an oxazoline-based cross-linking agent is laminated at least on a single surface of polyester film, 40 mole % or more of all diol components constituting the polyester resin is diethylene glycol, and the mass ratio of the polyester resin to the oxazoline-based cross-linking agent constituting the resin layer is within a range of 20/80 and 80/20.

As described so far, the intended adhesive properties are obtained only when a specific polyester resin is used as a polyester resin and also a resin layer is laminated which is prepared by mixing the polyester resin with an oxazoline cross-linking agent at a specific ratio.

In this instance, "a resin layer which contains a polyester resin and an oxazoline-based cross-linking agent" is a resin layer in which a mixture of the polyester resin with the oxazoline-based cross-linking agent is contained integrally. Therefore, that in which these materials are laminated separately in a stratified manner is not included.

Combination of the specific polyester resin with the oxazoline-based cross-linking agent at a mass ratio ranging from 20 to 80 to 80 to 20 provides excellent adhesive properties in laminating various laminating materials, when heat treatment is carried out for long periods of time at high temperatures, in particular when a laminating material such as metal that is different in dimensional stability under heating from a polyester film is laminated.

Although the mechanism of developing the intended adhesive properties remains unknown, such constitution that the resin layer is laminated would make the resin layer flexible when diethylene glycol accounts for 40 mole % or more all diol components constituting a polyester resin, thereby contributing to reduction in stress in laminating metal and others for long periods of time at high temperature. And such constitution would also increase a bonding force of polyester film with the resin layer when the oxazoline-based cross-linking agent is combined at the avobe ratio, thereby contributing to improvement of an interlayer adhesiveness in laminating metal and others for long periods of time at high temperatures. These synergistic effects would provide the intended adhesive properties.

In other words, the resin layer is provided which has a stress reducing effect and exhibits a boundary face adhesiveness with polyester film, thereby exhibiting an excellent adhesiveness, even when a laminating material such as metal that is different in dimensional stability under heating from a polyester film is laminated for long periods of time at high temperatures probably due to synergistic effects of these properties.

Furthermore, the resin layer is provided with excellent solvent resistance, thereby making it possible to improve adhesive properties for use in a laminating material which is obtained by coating a solution made of a solvent high in resin solubility, for example, a bi-polar nonprotonic solvent and the like.

To be more specific, adhesive properties and the solvent resistance can be obtained at the same time in giving heat treatment for long periods of time at high temperatures.

It is essentially important to give the mass ratio of a polyester resin to an oxazoline-based cross-linking agent constituting a resin layer within a range of 20/80 and 80/20. In the above range, it is possible to develop the above-described synergistic effects, provide an excellent adhesive properties when a laminating material such as metal that is different in dimensional stability under heating from a polyester film is laminated for long periods of time at high temperatures and also exhibit an excellent solvent resistance. Where the ratio is not in the above range, peeling between the polyester film and the resin layer may take place, thereby making it difficult to attain an intended adhesiveness. The mass ratio of the polyester resin to the oxazoline-based cross-linking agent is preferably within a range of 20/80 and 70/30, and more preferably of 30/70 and 60/40.

Where the ratio of the polyester resin described herein is lower than the above range, peeling on a resin layer boundary face with polyester film will easily take place when a laminated material like metal that is different in dimensional stability under heating from a polyester film is laminated for long periods of time at high temperatures. Although the mechanism of developing this phenomenon remains unknown, a reduced ratio of the polyester resin may be responsible for an insufficient stress-reducing effect inside the resin layer.

Furthermore, where the ratio of the oxazoline-based cross-linking agent is lower than the above range, peeling on the resin layer boundary face with the polyester film will easily take place. Although the mechanism of developing the phenomenon remains unknown, a reduced ratio of the oxazoline-based cross-linking agent may be responsible for an insufficient effect of boundary face adhesiveness on a boundary face between the polyester film and the resin layer.

Any compound with oxazoline as a functional group that can act as a cross-linking agent may be used as an oxazoline-based cross-linking agent, and there is no particular restriction thereon. However, preferable is an oxazoline-containing copolymer that has at least one type of oxazoline-containing monomers and that is also obtained by copolymerization with at least one type of other monomers.

In this instance, oxazoline-containing monomers include 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline and 2-isopropenyl-5-ethyl-2-oxazoline. They may be used solely or in combination with two or more types of them. Among other things, 2-isopropenyl-2-oxazoline is commercially available and preferable for this purpose.

Furthermore, any monomer which can be copolymerized with an oxazoline-containing monomer may be used as other monomers to copolymerize with an oxazoline-containing monomer, and there is no particular restriction thereon.

To be more specific, usable are, for example, acrylic esters or methacrylic esters such as methyl acrylate, methyl methacrylate, ethyl acrylate, ethyl methacrylate, butyl acrylate, butyl methacrylate, 2-ethylhexyl acrylate, 2-ethylhexyl methacrylate; unsaturated carboxylic acids such as acrylic acid, methacrylic acid, itaconic acid, maleic acid; unsaturated nitrites such as acrylonitrile, methacrylonitrile; unsaturated amides such as acrylamide, methacrylamide, N-methylolacrylamide, N-methylolmethacrylamide; vinyl esters such as vinyl acetate, vinyl propionate; vinyl ethers such as methyl vinyl ether, ethyl vinyl ether; olefins such as ethylene, propylene; halogen-including $\alpha$, $\beta$-unsaturated monomers such as vinyl chloride, vinylidene chloride, vinyl fluoride; $\alpha$, $\beta$-unsaturated aromatic monomers such as styrene, $\alpha$-methyl styrene. They may be used solely or in combination of two or more of them.

Where a resin layer contains an oxazoline-based cross-linking agent, there is no reduction in adhesiveness of a laminated polyester film for use in a laminating material even under the circumstances of high temperature and humidity, which is preferable.

It is also preferable that a resin layer contains an oxazoline-based cross-linking agent and a polyester resin in view of the adhesiveness of a laminated polyester film for use in a laminating material after moist heat treatment is given. Excellent adhesive properties after the moist heat treatment can offer a higher environmental resistance when a film onto which a laminating material is formed is processed and used as an electrical insulating material.

It is preferable that an oxazoline-based cross-linking agent contained in a resin layer is dissolved in water and used as a coating solution. When used as an aqueous coating solution, the oxazoline-based cross-linking agent is easily mixed with polyester and other components, thereby resulting in an improved adhesiveness of the resin layer.

In the polyester resin, it is necessary that diethylene glycol accounts for 40 mole % or more of all diol components constituting a polyester resin. An amount of diethylene glycol is preferably at 50 mole % or more of all diol components, and more preferably at 75 mole % or more. Where an amount of diethylene glycol is less than 40 mole % of all diol components, it is difficult to attain intended adhesive properties of. Furthermore, there is no particular restriction on an upper limit of diethylene glycol. Even if an amount of diethylene glycol is increased to 99 mole % or more of all diol components, no remarkable improvement is found in the adhesive properties. Therefore, the amount is sufficient in 99 mole % or less.

If an amount of diethylene glycol is less than 40 mole % of all diol components, peeling may easily take place on a resin layer boundary face with polyester film in a case where a laminating material such as metal that is different in dimensional stability under heating from a polyester film is laminated for long periods of time at high temperatures. Although the mechanism of this phenomenon remains unknown, a shortage of the amount of diethylene glycol may be responsible for insufficient stress-reducing effects inside the resin layer.

It is preferable that a polyester resin is dissolved in water and used as a solution. In this instance, in order to dissolve the polyester resin or disperse it in water easily, it is necessary to copolymeize a compound containing a sulfonate group as an acid component or a compound containing a trivalent or greater multivalent carboxylate group as an acid component. When the polyester resin is dissolved in water and used an as aqueous coating solution, it is mixed well with the oxazoline-based cross-linking agent and other components, resulting in an improved adhesiveness of a resin layer. The polyester resin used in this instance is the resin with an ester bond at a main chain or a branched chain.

Copolymerization rate of a compound which contains sulfonate groups or a compound which contains trivalent or greater multivalent carboxylate groups is preferably within a range of 0.5 mole % and 40 mole % of all acid components. Where the copolymerization rate is lower than 0.5 mole %, it is difficult to dissolve the polyester resin or disperse it in water, thereby resulting in a case where mixing with other aqueous solutions or dispersions is difficult to cause an inconvenience. Where the copolymerization rate is more than 40 mole %, there is a case where the adhesive properties may be reduced when the compound is kept under the environments of high temperature and humidity after formation of a laminating material.

Polyester resins prepared by copolymerization of compounds containing sulfonate groups as an acid component, are polyester resins prepared by copolymerization of acid components, for example, sulfoterephthalic acid, 5-sulfoisophthalic acid, 4-sulfoisophthalic acid, 4-sulfonaphthalene-2, 7-dicarboxylic acid, sulfo-p-xylylene glycol, 2-sulfo-1, 4-bis (hydroxyethoxy) benzene, or their alkaline metal salts, alkaline earth metal salts, and ammonium salts.

Polyester resins prepared by copolymerization of compounds containing trivalent or greater multivalent carboxylate groups as an acid component are polyester resins prepared by copolymerization of acid components, for example, trimellitic acid, anhydrous trimellitic acid, pyromellitic acid, anhydrous pyromellitic acid, 4-methyl cyclohexene-1,2,3-tricarboxylic acid, trimesic acid, 1,2,3,4-butane tetracarboxylic acid, 1,2,3,4-pentane tetracarboxylic acid, 3,3',4,4'-benzophenone tetracarboxylic acid, 5-(2,5-dioxo-tetrahydrofurfuryl)-3-methyl-3-cyclohexene-1,2-dicarboxylic acid, 5-(2,5-dioxo-tetrahydrofurfuryl)-3-cyclohexene-1, 2-dicarboxylic acid, cyclopentane tetracarboxylic acid, 2,3, 6,7-naphthalene tetracarboxylic acid, 1,2,5,6-naphthalene tetracarboxylic acid, ethylene glycol bis trimelitate, 2,2',3, 3'-diphenyl tetracarboxylic acid, thiophene-2,3,4,5-tetracarboxylic acid, ethylene tetracarboxylic acid, or their alkaline metal salts, alkaline earth metal salts, and ammonium salts.

A compound which contains sulfonate groups as an acid component is copolymerized to facilitate water dispersion, which is preferable in obtaining excellent adhesive properties. Copolymerization of a compound which contains sulfonate groups as acid component is able to fully exhibit the stress reducing effect of a resin layer and the effect of boundary face adhesiveness between polyester film and a resin layer and provide synergistic effects of these properties, thereby easily providing the effect of the adhesive properties.

In contrast, where a compound which contains sulfonate groups as an acid component is copolymerized to a less extent and a compound which contains trivalent or greater multivalent carboxylate groups is copolymerized to a greater extent, there may be a reduced effect of the adhesive properties.

Although the mechanism of this phenomenon remains unknown, where carboxylic acid is abundantly found in chains of polyester resin, there may be a case where the carboxylic acid reacts with oxazoline to develop many cross linkage points inside a resin layer. As a result, the stress-reducing effect and the effect of boundary face adhesiveness between polyester film and a resin layer may be reduced to cause a subsequent reduction in adhesive properties. Therefore, it is less likely to have cross linkage reaction with oxazoline in a resin layer. Namely, it is preferable to select a polyester resin with a low content of carboxylic acid.

Copolymerization rate of trivalent or greater multivalent carboxylate groups in a polyester resin is preferably 50 mole % or less of all acid components, more preferably 15 mole % or less and still more preferably 5 mole % or less.

Other acid components constituting the polyester resin include aromatic, aliphatic and alicyclic dicarboxylic acids.

Aromatic dicarboxylic acids include terephthalic acid, isophthalic acid, orthophthalic acid, phthalic acid, 2,5-dimethyl terephthalic acid, 1,4-naphthalene dicarboxylic acid, biphenyl dicarboxylic acid, 2,6-naphthalene dicarboxylic acid, 1,2-bis phenoxy ethane-p,p'-dicarboxylic acid and phenyl indandicarboxylic acid. Preferable are polyesters in which these aromatic dicarboxylic acids preferably account for 30 mole % or more of all acid components, more preferably 35 mole % or more, and particularly preferably 40 mole % or more in view of the strength and the heat resistance of a resin layer.

Furthermore, aliphatic and alicyclic dicarboxylic acids include succinic acid, adipic acid, sebacic acid, azelaic acid, dodecane dion acid, dimer acid, 1,3-cyclopentane dicarboxylic acid, 1,2-cyclohexane dicarboxylic acid, 1,4-cyclohexane dicarboxylic acid, and their ester-forming derivatives.

Diol components other than diethylene glycol of a polyester resin include ethylene glycol, polyethylene glycol, propylene glycol, polypropylene glycol, 1,3-propanediol, 1,3-butanediol, 1,4-butanediol, 1,5-pentanediol, 1,6-hexanediol, 1,7-heptanediol, 1,8-octanediol, 1,9-nonanediol, 1,10-decanediol, 2,4-dimethyl-2-ethyl-hexane-1, 3-diol, neopentyl glycol, 2-ethyl-2-butyl-1, 3-propanediol, 2-ethyl-2-isobutyul-1, 3-propanediol, 3-methyl-1, 5-pentanediol, 2,2,4-trimethyl-1, 6-hexanediol, 1,2-cyclohexane dimethanol, 1,3-cyclohexane dimethanol, 1,4-cyclohexane dimethanol, 2,2,4,4-tetramethyl-1, 3-cyclobutanediol, 4,4'-thiodiphenyl, bisphenol A, 4,4'-methylenediphenol, 4,4'-(2-norbornilidene)diphenol, 4,4'-dihydroxybiphenol, o-,m-, and p-dihydroxy benzene, 4,4'-isopropylidene phenol, 4,4'-isopropylidene bindiol, cyclopentane-1, 2-diol cyclohexane-1, 2-diol cyclohexane-1, and 4-diol.

Glass transition temperature (Tg) of a polyester resin is preferably within a range of 5 and 55° C. Where Tg is lower than 5° C., there may develop a blocking phenomenon that a resin layer adheres to another resin layer. Where Tg exceeds 55° C., there may be a case where the effect of adhesive properties will not develop or a resin is poor in stability and water dispersion. Tg is preferably within a range of 10 and 50° C. and more preferably of 15 and 40° C.

Several types of polyester resins with different Tg may be combined, and it is preferable that one or two types of polyester resin with 55° C. or lower Tg are used. Where a polyester resin with 55° C. or higher Tg is contained, there may be a case where an intended adhesiveness is not obtained to a sufficient extent.

Furthermore, in the present invention, polyester resins used a resin layer include modified polyester copolymers, for example, block copolymers and graft copolymers modified with acryl, urethane or epoxy.

Preferable polyester resins which are used in the resin layer include copolymers selected from terephthalic acid, isophthalic acid, sebacic acid and sodium-5-sulfoisophthalic acid as an acid component, and ethylene glycol, diethylene glycol, 1,4-butanediol and neopentyl glycol as a diol component.

In a laminated film, there is no particular restriction on a method for producing a polyester resin used in a resin layer. The polyester resin can be produced, for example, by the following method.

An explanation will be made for terephthalic acid, isophthalic acid, 5-sodium sulfoisophthalic acid as a dicarboxylic acid component, and a polyester resin made with ethylene glycol and diethylene glycol as a diol component. The polyester resin used in the resin layer can be produced by a method in which terephthalic acid, isophthalic acid and sodium-5-sulfoisophthalic acid directly subjected to estherification reaction with ethylene glycol and diethylene glycol, or a method consisting of a first stage that esterified terephthalic acid, isophthalic acid and 5-sodium sulfoisophthalic acid are subjected to ester interchange reaction with ethylene glycol and diethylene glycol and a second stage that reaction products resulting from the first stage are subjected to polymerization reaction.

In this instance, reaction catalysts include, for example, alkaline metals, alkaline earth metals, manganese, cobalt, zinc, antimony, germanium, titanium compounds.

A resin layer which contains a polyester resin and an oxazoline-based cross-linking agent is preferably within a range of 0.001 and 1 μm in thickness for a single surface. Where the thickness is lower than 0.001 μm, there may be a case where sufficient adhesive properties are not obtained. Where the thickness is greater than 1 μm, there may develop a problem that intrinsic properties of polyester film are deteriorated or physical properties of the film after formation of a laminating material are adversely influenced. The thickness of the resin layer is preferably within a range of 0.05 and 0.6 μm and more preferably of 0.1 and 0.4 μm.

Polyesters which are used in the polyester film include, for example, polyethylene terephthalate, polyethylene naphthalate, polypropylene terephthalate, polybutylene terephthalate and polypropylene naphthalate, and a mixture of two or more types of them. Furthermore, as far as the effect is not deteriorated, those prepared by copolymerization of other dicarboxylic acid components and diol components with the above substances are usable. The limiting viscosity of the polyester (determination is made in o-chlorophenol at 25□) is preferably within a range of 0.4 and 1.2 dl/g and more preferably of 0.5 and 0.8 dl/g.

Furthermore, a polyester film is preferably a biaxially-oriented film in view of the mechanical properties and dimensional stability. A biaxially orientation is, for example, a state where a polyester film, which is not stretched, namely, before completion of crystalline orientation, is stretched both in a longitudinal direction and a width direction 2.5 to 5.0 times greater than its original dimension and thereafter heated to complete the crystalline orientation and a biaxially-oriented pattern is confirmed by wide-angle X ray diffraction.

Polyester film is not necessarily a single layered film but a two or more-layered composite film made of an inner layer and a surface layer is also acceptable, as far as the effect is not deteriorated. The film includes, for example, a composite film made of an inner layer substantially free of particles and a surface layer containing particles, a composite film made of an inner layer containing coarse particles and a surface layer containing fine particles, and a composite film made of an inner layer containing fine air bubbles and a surface layer substantially free of air bubbles. Furthermore, the above composite films may be those in which the inner layer and the surface layer are different or similar in type of polyesters.

A polyimide-including layer is laminated on both surfaces of the above-described laminated polyester film, thereby providing a flame-retardant polyester film described in claim 4. It is preferable that the polyimide-including layer is free of halogen groups.

A laminated polyester film is laminated on a resin layer, by which such a film is obtained that has excellent adhesive properties with a polyimide-including layer. Therefore, a flame-retardant polyester film is made excellent in adhesive properties of each layer.

Hereinafter, an explanation will be made for the flame-retardant polyester film.

There is no particular restriction on the polyimide used, which is, however, preferably a polymer containing cyclic imide groups as a repeating unit. As far as the effect is not deteriorated, structural units such as aromatic unit, aliphatic unit, alicyclic unit, alicyclic ester unit and oxycarbonyl unit other than cyclic imide units may be contained in main chains of the polyimide.

It is preferable that the polyimide has, for example, a structural unit expressed by the following chemical formula 1.

Chemical formula 1

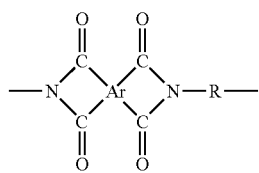

In the above formula 1, Ar denotes an aromatic group having carbon atoms from 6 to 42, R denotes a divalent organic group selected from groups made up of an aromatic group having carbon atoms from 6 to 30, an aliphatic group having carbon atoms from 2 to 30 and an alicyclic group having carbon atoms from 4 to 30.

In the above chemical formula 1, Ar includes substances expressed by the following chemical formula 2 and the chemical formula 3.
Chemical formula 2
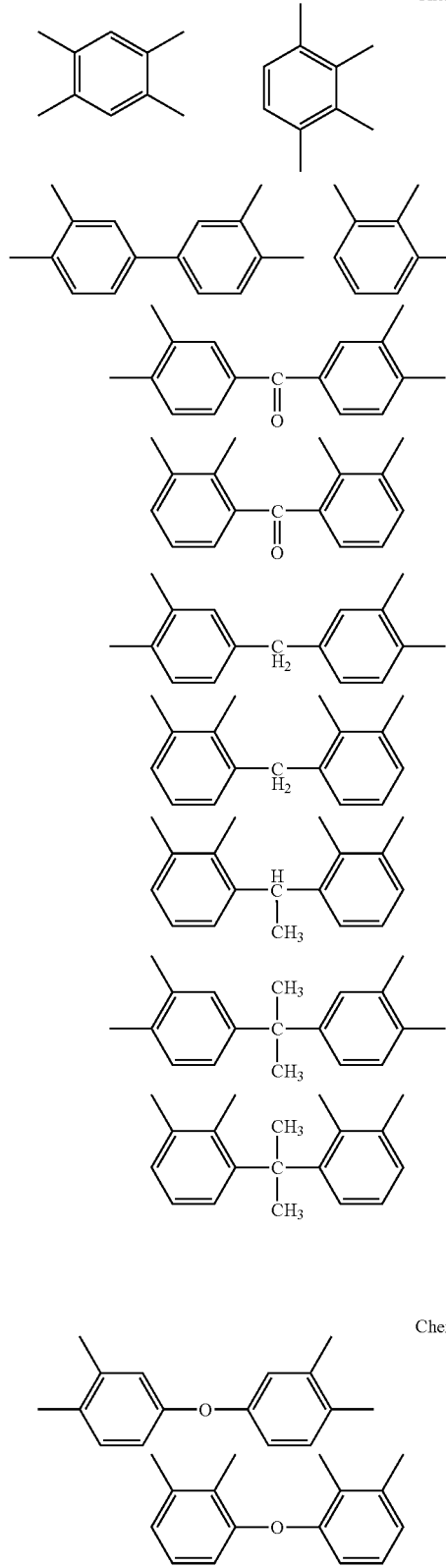
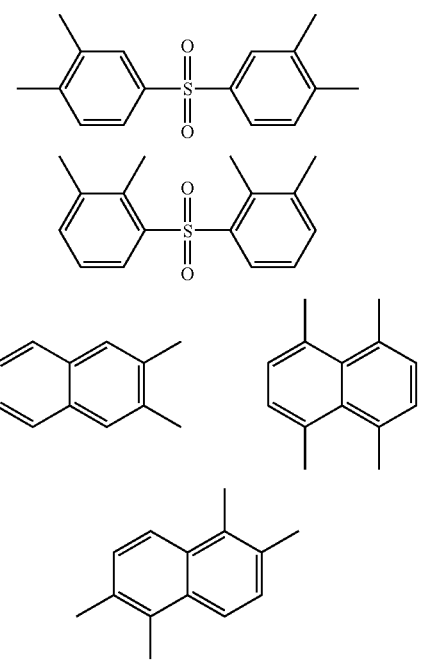
R includes substances expressed by the following chemical formula 4 and the chemical formula 5 (wherein n denotes an integral number from 2 to 30).
Chemical formula 4
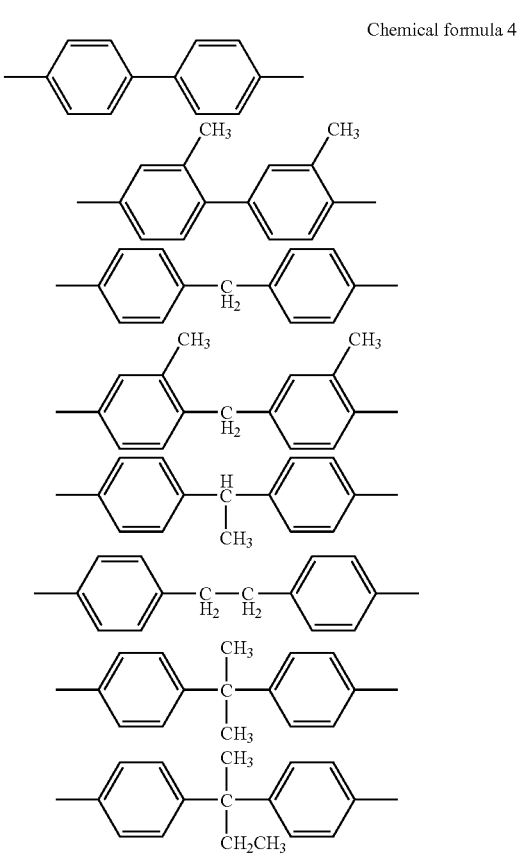
Chemical formula 3

-continued

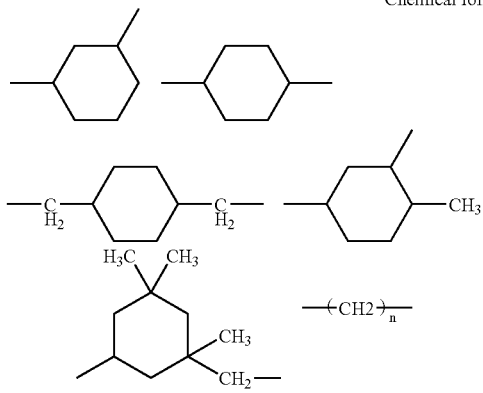

Chemical formula 5

One or two or more types of these substances may be found in polymer chains, as far as the effect is not deteriorated.

The polyimide can be produced by a conventionally known method. For example, there is a method in which tetracarboxylic acid, a raw material capable of inducing the above Ar, and/or its acid anhydride as well as one or two or more types of compounds selected from groups made up of aliphatic primary diamine and/or aromatic primary diamine, a raw material capable of inducing the above R are subjected to dehydration and condensation, thereby providing polyamic acid, and then heating and/or chemical ring-closing agents are used to perform dehydration and ring closure of the polyamic acid. There is another method in which tetracarboxylic acid anhydride and diisocyanate are heated to perform decarboxylation, thereby attaining polymerization.

Tetracarboxylic acids used in the above methods include, for example, pyromellitic acid, 1,2,3,4-benzen tetracarboxylic acid, 3,3',4,4'-biphenyl tetracarboxylic acid, 2,2',3,3'-biphenyl tetracarboxylic acid, 3,3',4,4'-benzophenone tetracarboxylic acid, 2,2',3,3'-benzophenone tetracarboxylic acid, bis(2,3-dicarboxyl phenyl) methane, bis (3,4-dicarboxyl phenyl) methane, 1,1'-bis (2,3-dicarboxyl phenyl) ethane, 2,2'-bis (3,4-dicarboxyl phenyl) propane, 2,2'-bis (2,3-dicarboxyl phenyl)propane, bis (3,4-dicarboxyl phenyl) ether, bis (2,3-dicarboxyl phenyl) ether, bis (3,4-dicarboxyl phenyl) sulfone, bis (2,3-dicarboxyl phenyl) sulfone, 2,3,6,7-naphthalene tetracarboxylic acid, 1,4,5,8-naphthalene tetracarboxylic acid, 1,2,5,6-naphthalene tetracarboxylic acid, 2,2'-bis [(2,3-dicarboxy phenoxy) phenyl] propane and/or their acid anhydrides.

Furthermore, diamines include, for example, aromatic primary diamines such as benzidine, diamino diphenylmethane, diamino diphenylethane, diamino diphenylpropane, diamino diphenylbutane, diamino diphenylether, diamino diphenylsulfone, diamino diphenylbenzophenone, o,m,p-phenylene diamine, tolylene diamine, xylene diamine, and aliphatic or alicyclic primary diamines such as ethylenediamine, 1,2-propanediamine, 1,3-propanediamine, 2,2-dimethyl-1,3-propanediamine, 1,6-hexamethylenediamine, 1,8-octamethylenediamine, 1,9-nonamethylenediamine, 1,10-decamethylenediamine, 1,1-undecamethylenediamine, 1,12-dodecamethylenediamine, 2,2,4-trimethyl hexamethylenediamine, 2,4,4-trimethyl hexamethylenediamine, 1,3-cyclohexanediamine, 1,4-cyclohexanediamine, 1,4-cyclohexane dimethylamine, 2-methyl-1,3-cyclohexanediamine and isophorone diamine.

In the above described method for producing polyimide where polyamic acid is produced and then heating and/or chemical ring closing agents are used to perform dehydration and ring closure, the following dehydrating agents and catalysts are favorably used.

Dehydrating agents include, for example, aliphatic acid anhydrides such as acetic anhydride and aromatic acid anhydrides. Furthermore, catalysts include, for example, aliphatic tertiary amines such as triethylamine; aromatic tertiary amines such as dimethylaniline; and heterocyclic tertiary amines such as pyridine, picoline and isoquinoline.

It is in particular preferable to use as a catalyst at least one type of compounds selected from hydroxyl pyridine compounds expressed by the following formula (I) (chemical formula 6) and imidazole compounds expressed by the following formula (II)(chemical formula 7).

Chemical formula 6

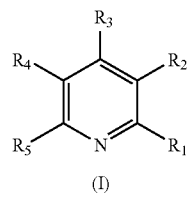

(I)

(In the formula (I), at least one of $R_1$, $R_2$, $R_3$, $R_4$ and $R_5$ belongs to a hydroxyl group. If not a hydroxyl group, they denote respectively any one of an aliphatic group having a hydrogen atom and carbons atoms from 1 to 30, an aromatic group having carbon atoms from 6 to 30, a cycloalkyl group having carbon atoms from 4 to 30, an aralkyl group having carbon atoms from 7 to 30 and a formyl group)

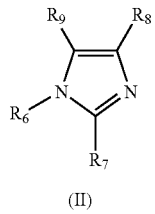

Chemical formula 7

(II)

(In the formula (II), $R_6$, $R_7$, $R_8$ and $R_9$ denote respectively any one of an aliphatic group having a hydrogen atom and carbon atoms from 1 to 30, an aromatic group having carbon atoms from 6 to 30, a cycloalkyl group having carbon atoms from 4 to 30, an aralkyl group having carbon atoms from 7 to 30 and a formyl group).

Hydroxy pyridine compounds expressed by the formula (I) include 2-hydroxy pyridine, 3-hydroxy pyridine, 4-hydroxy pyridine, 2,6-dihydroxy pyridine, 3-hydroxy-6-methyl pyridine and 3-hydroxy-2-methyl pyridine.

Regarding $R_1$, $R_2$, $R_3$ and $R_4$ in the formula (I), preferable aliphatic groups include an alkyl group, a vinyl group, a hydroxyalkyl group and a cyanoalkyl group having carbon number from 1 to 17. Preferable aromatic groups include a phenyl group and preferable aralkyl groups include a benzyl group.

Imidazole compounds expressed in the formula (II) include, for example, 1-methylimidazole, 1-ethylimidazole, 1-propylimidazole, 1-phenylimidazole, 1-benzylimidazole, 1-vinylimidazole, 1-hydroxyethylimidazole, 2-methylimidazole, 2-ethylimidazole, 2-propylimidazole, 2-isopropylimidazole, 2-butylimidazole, 2-undecylimidazole, 2-heptadecylimidazole, 2-phenylimidazole, 2-benzylimidazole, 4-methylimidazole, 4-phenylimidazole, 4-benzylimidazole, 1,2-dimethylimidazole, 1,4-dimethylimidazole, 1,5-dimethylimidazole, 1-ethyl-2-methylimidazole, 1-vinyl-2-methylimidazole, 2,4-dimethylimidazole, 2-ethyl-4-methylimidazole, 2-phenyl-4-methylimidazole, 2-butyl-4-hydroxymethylimidazole, 2-butyl-4-formylimidazole, 2,4-diphenylimidazole, 4,5-dimethylimidazole, 4,5-diphenylimidazole, 1-benzyl-2-methylimidazole, 1-benzyl-2-phenylimidazole, 1,2,5-trimethylimidazole, 1,4,5-trimethylimidazole, 1-methyl-4,5-diphenylimidazole, 2-methyl-4,5-diphenylimidazole, 2,4,5-trimethylimidazole, 2,4,5-triphenylimidazole, 1-cyanoethyl-2-methylimidazole, 1-cyanoethyl-2-ethyl-4-methylimidazole, 1-cyanoethyl-2-undecylimidazole and 1-cyanoethyl-2-phenylimidazole.

Since hydroxy pyridine compounds expressed by the formula (I) and imidazole compounds expressed by the formula (II) are effective in facilitating dehydration and ring closure reaction, addition of one type of compounds at least selected from these compounds is able to attain dehydration and ring closure reaction on heat treatment for a short time and at lower temperatures, thereby leading to an effective production, which is favorable. The selected compound is preferably used in 10 mole % or more in relation to repeating units of polyamic acid and more preferably in 40 mole % or more. Where it is added within a preferable range in relation to the repeating units of polyamic acid, the effect is sufficiently maintained that is capable of performing dehydration and ring closure even for a short time and at low temperatures. Repeating units of polyamic acid which do not undergo dehydration or ring closure may remain. However, when polyamic acid undergoes dehydration and ring closure fully to convert to polyimide at a higher ratio, the solvent resistance and moisture/heat resistance of a polyimide-including layer are improved, which is more preferable. There is no particular restriction on an upper limit of the added amount. It is, however, preferable that in general the addition is less than 300 mole % in relation to repeating units of polyamic acid in view of reducing the cost of raw materials.

It is particularly preferable that a structural unit expressed by the following formula (III) (chemical formula 8) is within a range of 70% and 100% of all structural units of polyimide.

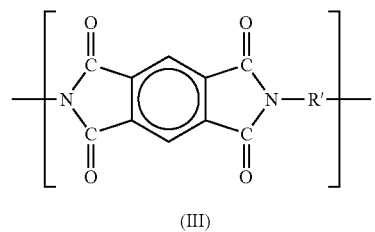

Chemical formula 8

(III)

(In the formula (III), R' denotes at least one type of groups selected from those expressed by the following formula (IV).)

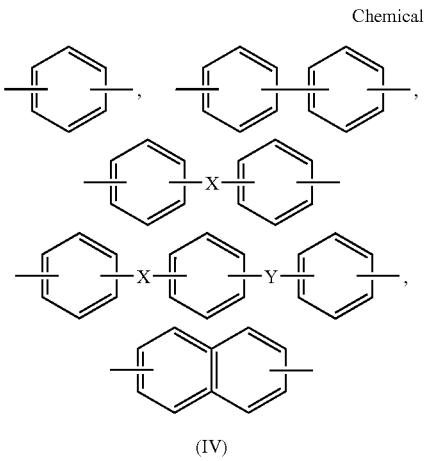

Chemical formula 9

(IV)

(In the formula (IV), X and Y denote at least one type of groups selected from those expressed by the following formula (V) (chemical formula 9).)

—O—, —$CH_2$—, —CO—, —$SO_2$—, —S—, —$C(CH_3)_2$— (V)

Where 70% or more of all the structural units of polyimide is not a structural unit expressed by the above formula (III), there may be a case where the effect of flame-retardant properties is reduced or the effect of flame-retardant properties is not provided fully, unless a laminated layer is made thicker, which is disadvantageous in productivity and cost effect. Furthermore, polyimide with 30% or more of structural units other than those expressed by the above formula (III) tends to be higher in cost of raw materials on synthesis of the polyimide, resulting in a problem of higher cost of a flame-retardant polyester film.

The polyimide is more preferably polyimide with 70% or more of a structural unit expressed by the following formula (VI) and in particular preferably polyimide with 90% or more of the structural unit expressed by the following formula (VI) (chemical formula 10).

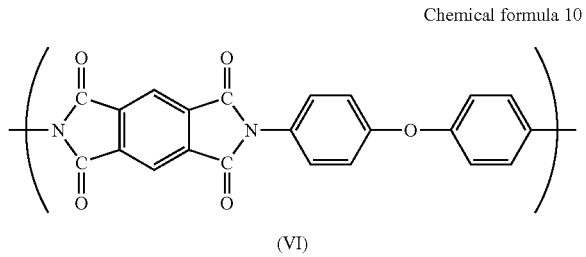

Chemical formula 10

(VI)

It is preferable that a layer including the polyimide contains a compound generating non-combustible gas, in addition to resin components. The effect of flame-retardant properties is exhibited more easily when the compound generating non-combustible gas is contained.

There is no particular restriction on compounds generating non-combustible gas. They include inorganic carboxides, inorganic hydroxides, triazine compounds, guanidine compounds, guanylurea compounds, halogen-including compounds, and these compounds may be used in combination of two or more types of them. Among other things, inorganic hydroxides and/or triazine compounds are preferable and inorganic hydroxides are particularly preferable in view of the flame-retardant properties.

Various types of inorganic hydroxides may be used for this purpose. Preferably usable are, for example, aluminum hydroxide, magnesium hydroxide, calcium hydroxide and zirconium hydroxide. Aluminum hydroxide and magnesium hydroxide are particularly preferable. Magnesium hydroxide is particularly preferable in view of the flame-retardant properties. Aluminum hydroxide is preferable because it hardly deteriorates a polyimide-including layer even when the polyimide-including layer is placed under the circumstances of high temperature and humidity. These inorganic hydroxides are preferably less than 1.5 µm in mean particle size, more preferably less than 1.0 µm, still more preferably less than 0.8 µm and in particular preferably less than 0.5 µm in view of the flame-retardant properties. Furthermore, it is preferable that where these inorganic hydroxides are coated with a coating layer made up of zinc compounds and/or boron compounds or subjected to surface treatment by using silane coupling agents, titanate coupling agents, aluminum coupling agents or aliphatic acids, the effect of flame-retardant properties is exhibited more easily.

Triazine compounds include, for example, melamine sulfate, melamine polyphosphate, melamine, melam, melem, melon, melamine cyanurate, melamine phosphate, succino guanamine, ethylene dimelamine, triguanamine, tris(β-cyano-ethyl-) isocyanurate, acetoguanamine, melem sulfate, melam sulfate.

In this instance, it is preferable to add a compound generating non-combustible gas within a range of 1 and 65 mass % in relation to a polyimide-including layer. On addition of the compound at less than 1 mass %, there may be a case where the effect of flame-retardant properties is not fully exhibited. On addition of the compound at more than 65 mass %, there may be a case where a polyimide-including layer becomes fragile or the effect of flame-retardant properties is not exhibited. A preferable addition is within a range of 5 and 60%, and more preferably of 10 and 50%. Furthermore, an amount of the compound generating non-combustible gas is preferably within a range of 0.01 and 20 mass % in relation to a whole amount of a flame-retardant polyester film, more preferably from 0.01 to 10 mass % and still more preferably from 0.01 to 3 mass %.

It is preferable that the ratio of thickness of a polyimide-including layer to whole thickness of the flame-retardant polyester film is within a range of 0.5 and 30%. Thickness of the polyimide-including layer is preferably within a range of 1.0 and 10% and more preferably of 1.0 and 5.0%. In this instance, thickness of the polyimide-including layer is a total thickness of both layers including polyimide. Where the ratio of thickness of the polyimide-including layer to that of the whole flame-retardant polyester film is within the above range, the effect of flame-retardant properties is fully exhibited to provide an excellent productivity. In this instance, thickness of the polyimide-including layer is preferably within a range of 0.05 and 10 µm for single surface, more preferably from 0.1 to 5 µm and still more preferably from 0.1 to 2.5 µm. Where the ratio of thickness of the polyimide-including layer is great and/or thickness of the polyimide-including layer is thick, there may be a case where the intrinsic mechanical strength of polyester film is reduced.

The polyimide-including layer may be formed, for example, by a method in which a polyimide-including layer and a laminated polyester film are laminated by co-extrusion, a method in which a polyimide-including layer is adhered to a laminated polyester film, and a method in which a solution for forming a polyimide-including layer is coated on a laminated polyester film and dried. Of these methods, a method for forming the polyimide-including layer by coating is preferable because the effect of adhesive properties of the laminated polyester film can be fully exhibited.

Furthermore, where a polyimide-including layer is allowed to contain a compound generating non-combustible gas, the method for forming the polyimide-including layer by coating is preferable because the polyimide-including layer can be formed under relatively mild conditions and the compound generating non-combustible gas can be easily prevented from denaturation. The method for forming the polyimide-including layer by coating can be performed by various coating methods, for example, reverse coating method, gravure coating method, rod coating method, bar coating method, die coating method and knife coating method. Heating by infrared ray may be also used for effectively drying a solvent.

There is no particular restriction on solvents to be used in preparing a coating solution for forming a polyimide-coating layer when coating is used to form the polyimide-including layer. The solvents include bi-polar nonprotonic solvents such as N-methyl-2-pyrrolidone, dimethylformamide, dimethyacetamide and dimethylsulfoxide; alcohols such as methyl alcohol, ethyl alcohol, isopropyl alcohol, n-butanol, isobutanol, 3-methoxy-3-methyl-1-butanol, 1, 3-butanediol, 3-methyl-1, 3-butane diol; ketones such as acetone, methylethyl ketone and methylisobutyl ketone; esters such as ethyl acetate and butyl acetate, toluene, ethylene glycol butyl ether, ethylene glycol, ethyl ether, ethylene glycol methyl ether, chloroform, and their mixed solvents. A solvent which contains alcohol, ketone, ester or toluene gives excellent coating properties to a laminated polyester film, which is preferable. It is more preferable that alcohols are contained in the solvent.

Various types of additives, resin components and cross-linking agents may be contained in the polyester film, polyimide-including layer and resin layer, as far as the effect is not deteriorated. For example, they include anti-oxidizing agents, heat resistance stabilizing agents, ultraviolet light absorbers, organic particles, inorganic particles, pigments, dyes, antistatic additives, nucleating agents, flame-retardants, acrylic resins, polyester resins, urethane resins, polyolefin resins, polycarbonate resins, alkyd resins, epoxy resins, urea resins, phenolic resins, silicone resins, rubber resins, wax compositions, melamine compounds, oxazoline cross-linking agents, methylolated or alkylolated urea-based cross-linking agents, acrylamides, polyamide resins, epoxy resins, isocyanate compounds, aziridine compounds, various silane coupling agents and various titanate coupling agents.

In particular, the addition of inorganic particles such as silica, colloidal silica, alumina, alumina sol, kaolin, talc, mica, calcium carbonate, barium sulfate, carbon black, zeolite, titanium oxide and metal fine powder will improve the good sliding properties and damage resistance, which is preferable. The inorganic particles are preferably within a range of 0.005 and 5 µm in mean particle size and more preferably from 0.05 to 1 µm. Furthermore, the addition is preferably from 0.05 to 20 mass % and more preferably from 0.1 to 10 mass %.

Then, an explanation will be made for a preferable method for producing a laminated polyester film by referring to examples. However, the examples do not restrict this disclosure.

It is preferable to produce the laminated polyester film by using a method in which a resin layer-forming coating solution is coated on both surfaces of the polyester film prior to completion of crystalline orientation and then the film is stretched at least toward one direction and also given heat treatment. A method is particularly preferable in which coating is conducted to provide a resin layer during film production processes in view of the productivity.

To be more specific, a melted and extruded polyester film prior to crystalline orientation is stretched 2.5 to 5 times greater than its original dimension in a longitudinal direction, and a resin layer-forming coating solution is continuously applied to the mono-axially stretched. The polyester film coated with the coating solution is allowed to pass through a zone heated in a step-wise manner, during which it is dried, and stretched 2.5 to 5 times greater than its original dimension in a traversal direction. Furthermore, the film is guided continuously to a heating zone kept at 150 to 250° C. to complete the crystalline orientation. This method (in-line coating method) or other methods are used laminate the resin layer.

It is preferable to laminate a resin layer by using the in-line coating method in view of the adhesive properties. Where the resin layer is laminated on polyester film prior to completion of crystalline orientation, the effect of boundary face adhesiveness between the polyester film and the resin layer is easily exhibited, consequently making it possible to exhibit easily an excellent adhesiveness in a case where a material such as metal that is different in dimensional stability under heating from a polyester film is adhered for long periods of time at high temperatures. Where the resin layer is formed on polyester film after completion of crystalline orientation, there may be a case where an excellent adhesiveness is not obtained.

Before lamination of a resin layer, the surface of polyester film is subjected corona discharge treatment or others to give a wetting tensile force on the surface of the polyester film preferably at 47 mN/m or greater and more preferably at 50 mN/m or greater, which is also favorable in view of an improved adhesive properties between the resin layer and the polyester film.

The surface of a laminated resin layer is subjected to corona discharge treatment or electrical discharge machining under nitrogen atmosphere and/or carbon dioxide atmosphere, which is favorable in view of a further improvement in adhesive properties between a resin layer and a polyimide-including layer.

Then, an explanation will be made for a preferable method for producing a flame-retardant polyester film by referring to the following examples. However, there is no restriction.

A solution prepared by adding aluminum hydroxide to a polyamic acid solution dissolved in N-methyl-2-pyrrolidone is coated on a resin layer on both surfaces of a laminated polyester film by bar coating method, dried and subjected to dehydration and ring closure at 150 to 250□, thereby providing a flame-retardant polyester film.

A laminated polyester film and a flame-retardant polyester film are usually within a range of 5 and 500 µm in thickness and may be selected appropriately depending on a use.

Where the thus-obtained laminated polyester film is subjected to heat treatment for long periods of time at high temperatures in laminating a laminating material, it is processed into a laminated polyester film with excellent adhesive properties and also an excellent solvent resistance particularly in a case where a laminated material that is different in dimensional stability under heating from a polyester film is laminated for long periods of time at high temperatures. Therefore, the film is appropriately used in magnetic recording materials, electrical insulating materials, capacitor materials, packaging materials, construction materials, and other various industrial materials for photography, graphic arts and heat-sensitive transcription.

Furthermore, the laminated polyester film can be appropriately used in copper-clad laminated plates, adhesive tapes, flat cables, insulation motors, substrate films of electrical insulating materials for electronic components and others by taking advantage of the excellent adhesive properties of carrying out heat treatment for long periods of time at high temperatures.

Furthermore, the thus-obtained flame-retardant polyester film is excellent in flame-retardant properties. In addition, the flame-retardant polyester film is provided with a sufficient flame-retardant properties, without addition of a flame-retardant to polyester film or copolymerization of halogen-including components or phosphorus-including components with polyester, therefore making it possible to provide the flame-retardant properties without reduction in intrinsic mechanical properties of the polyester film. It is also possible to inhibit the generation of dioxin or gas, which may contaminate processing steps. Furthermore, the flame-retardant polyester film is excellent in an interlayer adhesiveness. Therefore, the flame-retardant polyester film can be used appropriately in magnetic recording materials, capacitor materials, packaging materials, construction materials and other various industrial materials, in addition to copper-clad laminated plates, adhesive tapes, flexible print circuit substrates, membrane switches, film heaters, flat cables, insulation motors, electrical insulating materials for electronic components and others.

Finished products in which the flame-retardant polyester film is used, namely, copper-clad laminated plates, adhesive tapes, flexible print circuit substrates, membrane switches, film heaters, flat cables are given an excellent flame-retardant properties and also an excellent workability due to absence of permeated flame-retardants.

Since a copper-clad laminated plate in which the flame-retardant polyester film is used is excellent in flame-retardant properties and free of permeation of flame-retardants, it is a copper-clad laminated plate with excellent workability and also with excellent interlayer adhesiveness.

The copper-clad laminated plate is, for example, provided with a constitution in which a copper layer is laminated at least on a single surface of the above flame-retardant polyester film.

An anchor coat layer, an adhesive agent layer and a tackiness agent layer may be provided between a flame-retardant polyester film and a copper layer. The copper layer may be formed by a known method in which copper foil is adhered together, copper is subjected to vapor deposition, or copper is subjected to spattering.

The copper-clad laminated plate is used in an application where a copper layer is subjected to etching to give a circuit and used as a flexible print circuit substrate.

A circuit substrate in which the copper-clad laminated plate is used is a circuit substrate with excellent flexibility as well as with excellent interlayer adhesiveness.

The circuit substrate is, for example, provided with a constitution in which a copper layer at least on a single surface of the copper-clad laminated plate is processed into a form of circuit-pattern.

The circuit pattern can be formed by a known method in which the copper layer is subjected to etching and the like. The circuit substrate is used in applications in which it is used as a circuit substrate for various types of electrical appliances or electronic devices.

The laminated polyester film is excellent in adhesive properties and also excellent in solvent resistance, where it is subjected to heat treatment for long periods of time at high temperatures in laminating various types of laminating materials, in particular where a laminated material like metal that is different in dimensional stability under heating from a polyester film is laminated for long periods of time at high temperatures.

To be more specific, in order to attain a strong adhesion with a material like metal that is different from a polyester film, a laminated polyester film can be used in heat treatment for long periods of time at high temperatures, by which it is provided with an excellent adhesive properties with metal. Therefore, the laminated polyester film can be used appropriately as polyester film for copper-clad laminated plates used in circuit substrates for electrical appliances or electronic devices.

Furthermore, the laminated polyester film is used appropriately in magnetic recording materials, capacitor materials, packaging materials, construction materials and other various industrial materials, in addition to electrical insulating materials. However, the film is not restricted to the above-described applications but can be used in versatile industrial applications.

A flame-retardant polyester film in which the laminated polyester film is used is also a film with excellent flame-retardant properties. The flame-retardant polyester film is appropriately used in magnetic recording materials, capacitor materials, packaging materials, construction materials and other various industrial materials, in addition to electrical insulating materials. However, the film is not restricted to the above-described applications.

A copper-clad laminated plate in which the flame-retardant polyester film is used is a copper-clad laminated plate with excellent flame-retardant properties and also with excellent workability due to the absence of permeated flame-retardants as well as with excellent interlayer adhesiveness. The copper-clad laminated plate is appropriately used in an application where a copper layer is subjected to etching, processed into a circuit and used as a flexible print circuit substrate. However, the copper-clad laminated plate is not restricted to the above applications.

The circuit substrate in which the copper-clad laminated plate is used is a circuit substrate with excellent flexibility and interlayer adhesiveness. The circuit substrate can be used appropriately as a circuit substrate for various types of electrical appliances and electronic devices. However, the circuit substrate is not restricted to the above application.

Method for Determining Properties and Method for Evaluating Effects

The following is a method for determining property values and that for evaluating effects.

(1) Adhesive Strength

After formation of the copper-clad laminated plate, polyester film is cut out to give a dimension of 230 mm in length and 10 mm in width. Thereafter, a copper foil surface of the thus-cut copper-clad laminated plate is etched so that copper foil of 2 mm in width remains. In this instance, an etching solution used is a 40% aqueous solution of ferric chloride. After completion of the etching, the copper-clad laminated plate is washed with water and dried for 24 hours at room temperature to obtain samples for determining the adhesive properties.

Then, the thus-obtained samples for determining the adhesive properties are determined for adhesive strength. A universal-type tensile tester, model UTM-4-100 (made by Toyo Baldwin) is used to determine stripping load under conditions of tensile speed of 50 mm/minute and peeling of 90°. The following formula (a) is used to divide the stripping load by the width of the etched copper foil, 2 mm, thereby obtaining the adhesive strength. Samples exhibiting the adhesive strength of 80 g/mm or greater are considered as acceptable.

Adhesive strength(g/mm)=stripping load (g)/2 (mm)  formula (a)

(2) Observation of Peeling Boundary Face

Polyester film which was used for determination of the adhesive strength by the above (1) is cut out for cross section. A field emission-type scanning electron microscope (model JSM-6700F, made by JEOL Ltd.) is used to observe the cross section, by which a peeled boundary face after determination of adhesive strength is observed.

(3) Flame-Retardant Properties

A flame-retardant polyester film and a copper-clad laminated plate are cut out to give strip samples measuring 50 mm×200 mm, which are then rounded so as to give cylinders of 12.7 mm in diameter and 200 mm in length. The thus-cylindrically shaped sample is kept so that the longitudinal direction is perpendicular to the ground, and the lower end is exposed to about 20 mm-long flame for 3 seconds, with the upper end kept in the longitudinal direction. Then, the flame is placed away from the sample. At this moment, burning time of the sample after the flame is away from the sample is determined (burning time at the first flame contact). Then, where the sample will not burn completely but distinguish, after extinguishment, similarly as with the first flame contact, the sample is exposed to the flame and the flame is placed away from the sample for the second time, by which burning time of the film after the flame is away from the sample is determined (burning time at the second flame contact). Five samples are used to conduct the test repeatedly. The flame-retardant properties are evaluated at two stages by referring to a total burning time obtained at the first and the second flame contacts in these five samples.

Evaluation is made in such a way that "sample which will extinguish of itself within 50 seconds" is regarded as "excellent" and "that which will not extinguish of itself within 50 seconds or will burn completely" is regarded as "poor". That which is evaluated as excellent is regarded as acceptable (good) on the basis of the evaluation rank.

(4) Glass Transition Temperature (Tg)

SSC5200 Disk Station (made by Seiko Instruments Inc.) is connected to Robot DSC (differential scanning calorimeter) RDC220 (made by Seiko Instruments Inc.) to determine the glass transition temperature. After adjusted on an aluminum pan, a sample (10 mg) is set on a DSC instrument (reference: a similar type aluminum pan free of the sample) and heated for 5 minutes at 300° C. Thereafter, liquid nitrogen is used to quickly cool the sample. The thus-treated sample is heated at the rate of 10° C./minute to determine the glass transition temperature (Tg) by referring to the DSC chart.

EXAMPLE

Then, an explanation will be made by referring to embodiments. However, there is no restriction to the embodiments. First, coating solutions and others will be described.

Coating Solutions for Forming a Resin Layer

An oxazoline-based cross-linking agent solution and a polyester resin solution shown below are mixed so as to give a mass ratio (mass ratio on dry solid basis) enlisted in Table 1 to prepare a resin layer-forming coating solution.

---

(1) Oxazoline-based cross-linking agent solution

Oxazoline-based cross-linking agent solution 1:
"Epocros" (registered trade name) WS-700 made by Nippon Shokubai Co., Ltd.

(2) Polyester resin solution

Polyester resin solution 1:
Acid components

| | |
|---|---|
| isophthalic acid | 93 mole % |
| 5-sodium sulfoisophthalic acid | 7 mole % |
| diol components | |
| ethylene glycol | 10 mole % |
| diethylene glycol | 90 mole % |

Aqueous solution of polyester resin consisting of the above acid components and diol components. Tg of 18° C.
Polyester resin solution 2:
Acid components

| | |
|---|---|
| isophthalic acid | 91 mole % |
| 5-sodium sulfoisophthalic acid | 9 mole % |
| diol components | |
| ethylene glycol | 5 mole % |
| diethylene glycol | 80 mole % |
| cyclohexane dimethanol | 15 mole % |

Aqueous solution of polyester resin made up of the above acid components and the diol components. Tg of 35° C.
Polyester resin solution 3:
Acid components

| | |
|---|---|
| terephthalic acid | 86 mole % |
| 5-sodium sulfoisophthalic acid | 14 mole % |
| Diol components | |
| ethylene glycol | 50 mole % |
| diethylene glycol | 50 mole % |

Aqueous solution of polyester resin made up of the above acid components and the diol components. Tg of 47° C.

-continued

Polyester resin solution 4:
Acid components

| | |
|---|---|
| terephthalic acid | 88 mole % |
| 5-sodium sulfoisophthalic acid | 12 mole % |
| Diol components | |
| ethylene glycol | 95 mole % |
| diethylene glycol | 5 mole % |

Aqueous solution of polyester resin made up of the above acid components and the diol components. Tg of 80° C.
Polyester resin solution 5:
Acid components

| | |
|---|---|
| terephthalic acid | 60 mole % |
| isophthalic acid | 14 mole % |
| trimellitic acid | 20 mole % |
| sebacic acid | 6 mole % |
| Diol components | |
| ethylene glycol | 28 mole % |
| neopentyl glycol | 38 mole % |
| 1,4-butanediol | 34 mole % |

Water dispersions prepared by using ammonia water to make water-soluble a polyester resin made up of the above acid components and the diol components. Tg of 20° C.
Polyester resin solution 6:
Acid components

| | |
|---|---|
| terephthalic acid | 48 mole % |
| isophthalic acid | 48 mole % |
| 5-sodium sulfoisophthalic acid | 4 mole % |
| Diol components | |
| ethylene glycol | 80 mole % |
| diethylene glycol | 20 mole % |

Aqueous solution of polyester resin made up of the above acid components and the diol components (the solvent is a mixed solvent of t-butyl cellosolve with water).
Tg of 60° C.

---

Coating Solution for Forming a Polyimide-Including Layer (1) Coating Solution A

Weighed 4,4'-diamino diphenyl ether is added to a dried flask, together with N-methyl-2-pyrrolidone and dissolved by agitation. Then, pyromellitic dianhydride is added to the solution so as to give 100 mole in relation to 100 mole of 4,4'-diamino diphenyl ether and keep the reaction temperature at 60° C. or lower. Thereafter, when the viscosity is kept constant (at the terminal point of polymerization), polymerization is completed to obtain a polymerized solution of polyamic acid. The solution is diluted by using N-methyl-2-pyrrolidone so as to give 10 mass % on dry solid basis. Thereafter, a solution prepared by dispersing aluminum hydroxide particles ("Higilite" (registered trade mark) H-43M, made by Showa Denko K.K., mean particle size of 0.75 μm) in N-methyl-2-pyrrolidone so as to give 10 mass % on dry solid basis is added thereto so that the mass ratio of polyamic acid to aluminum hydroxide is 70 to 30 on dry solid basis. Furthermore, prior to coating, 2-methylimidazole is added at 100 mole % to repeating units of polyamic acid. The thus-prepares solution is obtained as a coating solution A.

Examples 1 to 6, 8, 9; Comparative Examples 1 to 5

After a sufficient vacuum drying of polyethylene terephthalate resin pellets (hereinafter, sometimes, described as PET pellets) which contains 0.015 mass % of colloidal silica with a particle size of 0.4 μm and 0.005 mass % of colloidal silica with a particle size of 1.5 μm, the resin is supplied to an extruder and melt at 285° C. The thus-melted resin is extruded from a T-shaped die in a sheet form, wound around a mirror-finish casting drum, the surface temperature of which is 25° C., cooled and solidified by using an electrostatic application cast method to obtain an unstretched film. The unstretched film is heated up to 90° C., stretched in the longitudinal direction 3.3 times greater than its original dimension to give a mono-axially stretched film (hereinafter, referred to as base PET film). Both surfaces of the base PET film are subjected to corona discharge treatment in an air, thereby obtaining 55 mN/m of wetting tensile force of the base PET film. A resin layer-forming coating solutions enlisted in Table 1 is coated on both surfaces of the base PET film. Then, the base PET film on which the resin layer-forming coating solution is coated is guided to a preheating zone, with the film kept by using a pair of clips, and dried at 90° C. Thereafter, the film is continuously stretched 3.5 times greater than its original dimension in the traversal direction in a heating zone kept at 105° C., and subjected to more heat treatment in the heating zone kept at 220° C. to complete crystalline orientation, by which a laminated polyester film is obtained.

The film is 75 μm in thickness and the resin layer is 0.2 μm in thickness for a single surface.

Then, a coating solution A is coated on both surfaces of the laminated polyester film and dried at 130° C. Furthermore, the film is dried at 200° C. and subjected to heat treatment, by which the flame-retardant polyester film is obtained. A polyimide-including layer of the film is 1.81 μm in thickness for a single surface.

Furthermore, a TAB adhesive tape #7100 (made by Toray Industries Inc.) is pressed and attached on a single surface of the flame-retardant polyester film by using a roll, the temperature of which is elevated to 140° C., and thereafter a 38 μm-thick copper foil is pressed on the adhesive tape and adhered together by using the roll kept at 140° C. The flame-retardant polyester film to which the copper foil is adhered is subjected to heat treatment for two hours at 80° C. and then subjected to heat treatment for two hours at 160° C., by which a copper-clad laminated plate is obtained. Table 1 shows evaluation results of the adhesive strength. Observations of peeled boundary faces have confirmed that peeling does not occur at each boundary between the layers, but polyester film, which is a base material, is broken in the examples 1 to 6, 8 and 9. In contrast, in comparative examples 1 to 5, peeled boundary faces have been found between the polyester film and a resin layer. When evaluation is made for flame-retardant properties of the flame-retardant polyester film and the copper-clad laminated plate, it is found that the evaluation rank is acceptable, or "excellent" in all the embodiments from 1 to 6, 8 and 9 as well as in all comparative examples from 1 to 5.

Example 7

A laminated polyester film is obtained in a similar manner as in the embodiment 2 except that a resin layer-forming coating solution is coated only on a single surface of a base PET film. Then, a coating solution A is coated on both surfaces of the laminated polyester film, dried at 130° C. and then subjected to heat treatment at 200° C., by which a flame-retardant polyester film is obtained. The polyimide-including layer of the film is 1.8 μm in thickness for a single surface. Thereafter, in a manner similar to that used in the examples 1 to 6, 8 and 9, a copper foil is adhered, together with a surface side, on which the resin layer-forming coating solution is coated, thereby obtaining a copper-clad laminated plate.

Evaluation has revealed that the adhesive strength of the copper-clad laminated plate is 100 g/mm. Observations of peeled boundary faces have confirmed that peeling does not occur at each boundary between the layers, but polyester film, which is a base material, is damaged. Furthermore, evaluation of flame-retardant properties of the flame-retardant polyester film and the copper-clad laminated plate has found that the evaluation rank is acceptable, or "excellent".

Example 10

Copper foil is etched on a copper-clad laminated plate prepared in the embodiment 1 as with the previously-described method for determining (1) adhesive strength to form a circuit with 2 mm line and 2 mm pitch, by which a circuit substrate is formed. The line part of the circuit substrate is peeled at 90° C., as with the previously described method for determining (1) adhesive strength and evaluated for adhesive strength, finding that the strength is 100 g/mm. Observations of peeled boundary faces have confirmed that peeling does not cause at each boundary between the layers, but polyester film, which is a base material, is damaged.

Table 1–3 shows evaluation results of the adhesive strength obtained in examples 1 to 9 and comparative examples 1 to 5.

TABLE 1

| | Polyester resin | Oxazoline-based cross-linking agent | Mass ratio Polyester resin to oxazoline-based cross-linking agent | Percentage of diethylene glycol in diol components (mole %) | Adhesive strength (g/mm) |
|---|---|---|---|---|---|
| Example 1 | polyester resin solution 1 | oxazoline-based cross-lining agent solution 1 | 20/80 | 90 | 90 |
| Example 2 | polyester resin solution 1 | oxazoline-based cross-lining agent solution 1 | 40/60 | 90 | 100 |
| Example 3 | polyester resin solution 1 | oxazoline-based cross-lining agent solution 1 | 70/30 | 90 | 90 |
| Example 4 | polyester resin solution 1 | oxazoline-based cross-lining agent solution 1 | 80/20 | 90 | 80 |

TABLE 1-continued

|  | Polyester resin | Oxazoline-based cross-linking agent | Mass ratio Polyester resin to oxazoline-based cross-linking agent | Percentage of diethylene glycol in diol components (mole %) | Adhesive strength (g/mm) |
| --- | --- | --- | --- | --- | --- |
| Example 5 | polyester resin solution 2 | oxazoline-based cross-lining agent solution 1 | 40/60 | 80 | 100 |
| Example 6 | polyester resin solution 3 | oxazoline-based cross-lining agent solution 1 | 40/60 | 50 | 80 |

TABLE 2

|  | Polyester resin | Oxazoline-based cross-linking agent | Mass ratio Polyester resin to oxazoline-based cross-linking agent | Percentage of diethylene glycol in diol components (mole %) | Adhesive strength (g/mm) |
| --- | --- | --- | --- | --- | --- |
| Example 7 | polyester resin solution 1 | oxazoline-based cross-lining agent solution 1 | 40/60 | 90 | 100 |
| Example 8 | polyester resin solution 1 | oxazoline-based cross-lining agent solution 1 | 30/70 | 90 | 100 |
| Example 9 | polyester resin solution 1 | oxazoline-based cross-lining agent solution 1 | 60/40 | 90 | 100 |

TABLE 3

|  | Polyester resin | Oxazoline-based cross-linking agent | Mass ratio Polyester resin to oxazoline-based cross-linking agent | Percentage of diethylene glycol in diol components (mole %) | Adhesive strength (g/mm) |
| --- | --- | --- | --- | --- | --- |
| Comparative example 1 | polyester resin solution 1 | oxazoline-based cross-lining agent solution 1 | 10/90 | 90 | 60 |
| Comparative example 2 | polyester resin solution 1 | oxazoline-based cross-lining agent solution 1 | 90/10 | 90 | 20 |
| Comparative example 3 | polyester resin solution 4 | oxazoline-based cross-lining agent solution 1 | 40/60 | 5 | 50 |
| Comparative example 4 | polyester resin solution 5 | oxazoline-based cross-lining agent solution 1 | 40/60 | 0 | 40 |
| Comparative example 5 | polyester resin solution 6 | oxazoline-based cross-lining agent solution 1 | 40/60 | 20 | 60 |

What is claimed is:

1. A laminated polyester film, wherein a resin layer including a polyester resin and an oxazoline-based cross-linking agent is laminated on at least one side surface of a polyester film, diethylene glycol accounts for 40 mole % or more of all diol components constituting the polyester resin, and the mass ratio of the polyester resin to the oxazoline-based cross-linking agent constituting the resin layer is within a range of 20/80 to 60/40.

2. The laminated polyester film as set forth in claim 1, wherein diethylene glycol accounts for 50 mole % to 99 mole % of all diol components constituting the polyester resin.

3. The laminated polyester film as set forth in claim 1, wherein diethylene glycol accounts for 75 mole % to 99 mole % of all diol components constituting the polyester resin.

4. A flame-retardant polyester film in which a polyimide-including layer is laminated on both sides of the laminated polyester film claimed in any one of claims 1 to 3.

5. A copper-clad laminated plate in which the flame-retardant polyester film claimed in claim 4 is used.

6. A circuit substrate in which the copper-clad laminated plate claimed in claim 5 is used.

* * * * *

UNITED STATES PATENT AND TRADEMARK OFFICE
CERTIFICATE OF CORRECTION

| | | |
|---|---|---|
| PATENT NO. | : 7,226,664 B2 | Page 1 of 1 |
| APPLICATION NO. | : 11/439793 | |
| DATED | : June 5, 2007 | |
| INVENTOR(S) | : Tanaka et al. | |

It is certified that error appears in the above-identified patent and that said Letters Patent is hereby corrected as shown below:

<u>In Column 4</u>

At line 3, after "SUMMARY" please delete "OF THE INVENTION".

<u>In Column 9</u>

At line 19, after "Furthermore,", please delete "in the present invention".

Signed and Sealed this

Twenty-fifth Day of December, 2007

JON W. DUDAS
*Director of the United States Patent and Trademark Office*